United States Patent

[11] 3,624,468

[72] Inventors Frederik Leonard Sangster
Emmasingel, Eindhoven;
Rijkent Jan Nienhuis, Nijmegen, both of
Netherlands

[21] Appl. No. 818,725
[22] Filed Apr. 23, 1969
[45] Patented Nov. 30, 1971
[73] Assignee U. S. Philips Corporation
New York, N.Y.
[32] Priorities Apr. 23, 1968
[33] Netherlands
[31] 6805785;
Mar. 25, 1969, Netherlands, No. 6904620

[54] INSULATED GATE FIELD-EFFECT TRANSISTOR WITH OPPOSITE-TYPE GATE CONNECTED REGION INSET IN SOURCE OR DRAIN
5 Claims, 3 Drawing Figs.

[52] U.S. Cl. ........................................................ 317/235 R,
317/235 B, 317/235 G, 307/304
[51] Int. Cl. ........................................................ H01l 19/00
[50] Field of Search ............................................ 317/235,
21.1, 22.2; 307/304, 202; 328/128; 330/38 FE

[56] References Cited
UNITED STATES PATENTS

| | | | |
|---|---|---|---|
| 3,264,493 | 8/1966 | Price | 317/235 |
| 3,441,748 | 4/1969 | Werner | 317/235 |
| 3,470,390 | 9/1969 | Lin | 317/275 |
| 3,543,052 | 11/1970 | Kahng | 317/235 |

*Primary Examiner*—Jerry D. Craig
*Attorney*—Frank R. Trifari

ABSTRACT: An insulated gate field-effect transistor is described in which an additional region of the opposite type conductivity is inset in the source or drain regions and connected to the gate. The additional junction thereby formed is reverse biased during operation. When inset in the drain, the reverse-biased junction provides additional gate-drain capacitance for a Miller integrator circuit, whereas when inset in the source, the additional junction can act as a safety diode between the gate and source. The low breakdown voltage of the additional junction due to the high-impurity content of the regions increases the protection afforded by the safety diode.

Figure 1:
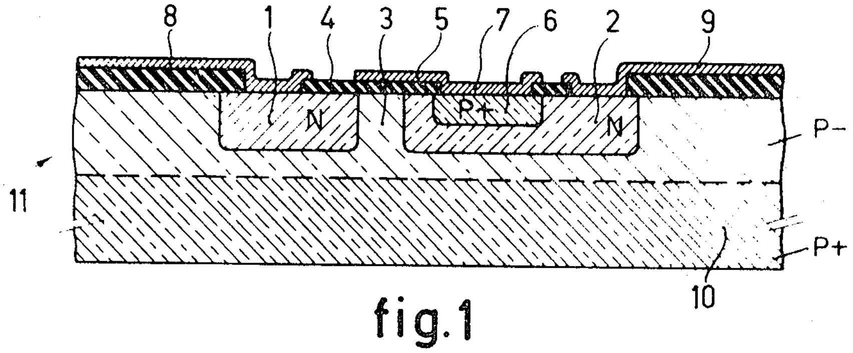

INVENTORS.
FREDERIK L.J. SANGSTER
RIJKENT J. NIENHUIS
BY
AGENT

INSULATED GATE FIELD-EFFECT TRANSISTOR WITH OPPOSITE-TYPE GATE CONNECTED REGION INSET IN SOURCE OR DRAIN

The invention relates to a field-effect transistor comprising a semiconductor body in which two surface regions of the same conductivity type extend from the same surface, while between said surface regions a channel region extends which adjoins the said surface regions and the said surface, an electrode which is separated from the channel region by an insulating layer extending above the channel region.

In the known field-effect transistors having an insulated gate electrode the capacity between the gate electrode on the one hand and the source and drain electrode on the other hand is minimized so as to restrict undesired capacitive coupling between the various connection electrodes.

It is the object of the invention to provide a new advantageous structure for a field-effect transistor and it is inter alia based on the recognition of the fact hat for certain applications the capacity between the gate electrode and the source and/or drain electrode can advantageously be made large and that this can simply be reached by the addition of an extra region to the known structure.

The invention is furthermore based on the recognition of the fact that by the addition of an extra region to the known structure a field-effect transistor can simply be obtained the insulated gate electrode of which shows a good safety against breakdown of the layer situated below said electrode as a result of the occurrence of undesired interference voltages.

Field effect transistors having a safety diode are described in "Proceedings of the I.E.E.E." July 1968, pp. 1,223–1224.

It has been found that in spite of the presence of such a safety diode, serious damage to the field-effect transistor can occur nevertheless due to undesired high-voltage pulses occurring. This is inter alia due to the inertia of the diode. This means that when a high-voltage pulse occurs, the capacitor constituted by the gate electrode, the insulating layer and the substrate is charged more rapidly than the safety diode, so that breakdown of the insulating layer can occur before the diode has reached its breakdown voltage.

The invention is inter alia based on the recognition of the fact that the said inertia of the diode is to a considerable extent the result of the fact that the current which flows through the diode when the diode breaks down and/or is charged, is supplied or drained via tHe substrate. Since the substrate of the field-effect transistor usually is high ohmic, the resistance in the field-effect transistor for currents which pass the diode actually is high. When this resistance decreases, the diode becomes more rapid so that the possibility of breakdown of the insulating layer is reduced. In addition, the possibility that destructively large charging currents occur by which, for example, the connection between the gate electrode and the safety diode could be destroyed by heating becomes smaller.

The invention is furthermore based on the recognition of the fact that, in order to reduce the inertia of the diode, the currents which flow through the diode can advantageously be conducted via an electrode region of the field-effect transistor.

According to the invention, a field-effect transistor of the type mentioned in the preamble is characterized in that at least one of the surface regions in the semiconductor body surrounds a further surface region, which further surface region, which is of a conductivity type opposite to that of the two surface regions, is connected to the said gate electrode via a connection conductor.

In order to increase the capacity between the gate electrode and the source or drain electrode, the capacity of a reversely biased PN-junction is used in which said capacity requires comparatively little extra surface area because the further surface region is provided wholly inside the source or drain electrode.

It is to be noted that the above-mentioned PN-junction must be biased in the reverse direction in the operating condition. In many circuits, particularly when field-effect transistors having a low-threshold voltages are used, at least the voltage between the gate electrode and the drain electrode will be such that if the further surface region is provided inside the drain electrode, the said PN-junction is indeed biased in the reverse direction. Such field-effect transistors having an increased capacity between the gate electrode and the source or drain electrode may be used, for example, as a Miller integrator or in capacitor memories, as described, for example, in prior patent application Ser. No. 817,690, filed Apr. 21, 1969.

The invention furthermore provides a field-effect transistor having a gate electrode protected against breakdown of the insulating layer and being of a simple and particularly compact structure, the safety diode being particularly rapid because upon breakdown or charging of the diode, the diode current flows directly through an electrode region which is more highly doped than the substrate.

The inertia of the safety diode can even be further reduced by reducing the breakdown voltage of the PN-junction between the extra region and the surrounding electrode region.

An important embodiment of the field-effect transistor according to the invention is characterized in that the breakdown voltage of the PN-junction between the one and the further surface region is at most 15 volts.

A very favorable breakdown voltage of the safety diode lies between 5 and 10 volts.

In many applications of field-effect transistors the voltage at the gate electrode during normal operation is so low that a safety diode with such a low breakdown voltage can be used without any objection, in which, due to said low breakdown voltage, a very efficacious and sure safety of the gate electrode can be realized.

The invention furthermore relates to a circuit arrangement comprising a field-effect transistor according to the invention, which circuit arrangement is characterized in that an input circuit is provided between the one surface region comprising the further surface region and the gate electrode and an output circuit is provided between the two surface regions of the same conductivity type.

In this manner the safety diode is connected across the input of the field-effect transistor and the current is conducted through the safety diode via the electrode which is common for the electric input and output. In that case the diode current can be conducted with a very small series resistance to a point in the circuit which usually is set up at a reference potential, for example, ground, which benefits the safety.

Figure 2:
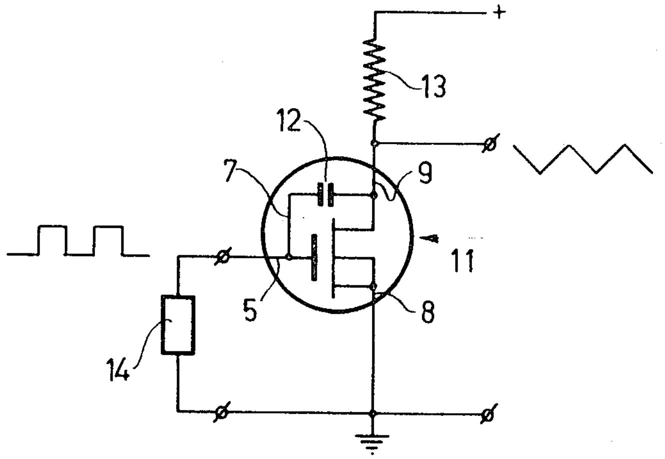
Figure 3:
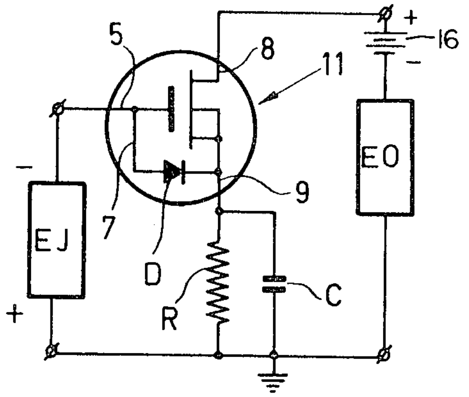

In order that the invention may be readily carried into effect, a few examples thereof will now be described in greater detail, by way of example, with reference to the diagrammatic drawing, in which FIG. 1 is a diagrammatic cross-sectional view of an embodiment of the field-effect transistor according to the invention, while FIG. 2 is a first circuit arrangement having a transistor according to the invention, in which the transistor is shown with a simple equivalent-circuit diagram, and FIG. 3 shows a second circuit arrangement having a transistor according to the invention, in which the transistor is shown with another simple equivalent-circuit diagram.

The field-effect transistor 11 shows in FIG. 1 comprises a semiconductor body 10 in which two surface regions 1 and 2 of the same conductivity type extend from the same surface, while a channel region 3 the usual inversion region of a P-substrate adjoining the said surface regions and the semiconductor surface is situated between said surface regions 1 and 2. An electrode 5 extends above the channel region 3 and is separated therefrom by the insulating layer 4. According to the invention, at least one of the surface regions, in this case the electrode region 2, in the semiconductor body 10 surrounds a further surface region 6 which is of a conductivity type opposite to that of the surface regions 1 and 2. Furthermore, the surface region 6 is provided with a connection conductor 7 through which the region 6 is connected to the gate electrode 5.

In this embodiment the capacity of the PN-junction between the regions 2 and 6 may be used. It is desirable that said PN-junction in the operating condition is always biased in the reverse direction. Often, particularly when field-effect transistors are used having a low-threshold voltage, the voltage between the gate electrode and the drain electrode will be such that this is the case indeed.

Furthermore, in the present example the electrode region 1 is provided with a connection conductor 8 and the electrode region 2 is provided with a connection conductor 9. Furthermore the substrate 10 may be provided with a connection conductor which is not shown in the figure, so as to be able to bias in the reverse direction, during operation, the PN-junctions between the source and drain electrodes of one conductivity type and the surrounding semiconductor region which is of the other conductivity type. Such a connection conductor may be provided both on the upper side and on the lower side of the semiconductor body or substrate. Inter alia in the latter case, a substrate 10 may advantageously be used having a low resistivity on which an epitaxial layer of the same conductivity type but having a higher resistivity is provided as is diagrammatically shown in FIG. 1 by a broken line. Alternatively, the PN-junction between one of the electrode regions 1,2 and the surrounding semiconductor region may be short circuited.

FIG. 2 shows an equivalent circuit diagram for the transistor 11 as shown in FIG. 1 for the case in which the first surface region is used to increase the capacity. In this example the connection conductors 8 and 9 of the transistor form the connections of the source an drain electrodes, respectively, so that the extra capacity 12, constituted by the PN-junction between the regions 2 and 6, occurs between the gate electrode 5 and the drain electrode 9.

For simplicity, a short circuit is furthermore shown between the source electrode and the substrate. It will be obvious, however, that the substrate may also be provided with a separate connection which in a circuit can be connected externally to a point of suitable potential.

It is furthermore shown in FIG. 2 how this transistor can be connected as a Miller integrator. The drain electrode 9 is connected, via a resistor 13, to a supply voltage source (not shown) while between the gate electrode 5 and the source electrode 8 an input circuit is provided which is diagrammatically shown in the Figure by the block 14. When a square wave voltage is applied, for example, to the input of the transistor as shown in the Figure, the integrated signal shown in the Figure can be obtained at the output.

An equivalent circuit diagram for the field-effect transistor shown in FIG. 1, in which the extra region 6 is used as a safety diode, is shown in FIG. 3. The structure described constitutes a field-effect transistor provided with a safety diode D. In this case also the connection 5, 8 and 9 correspond to the metal layers 5, 8 and 9 of FIG 1. The transistor 11 is incorporated in a circuit in which the source electrode, to which in this case the region 2 belongs, is connected via a resistor R and a capacitor C to ground. The input circuit EI is connected to the connection 5 and ground and the output circuit EO is connected to ground and the drain electrode 8 and hence to the surface region 1. A drain-biasing source 16 is provided, as is known, to reverse bias the N drain 1. The safety diode D will be reverse biased, as earlier described, by the current flow through the resistor R. In such conventional N-channel circuits, the input signal will normally be negative going. Pulsatory charge and breakdown currents can flow via current paths having a low resistance between the diode D and ground and between the diode D and the connection 5. In particular the resistance between the diode D and the connection 9, in other words between the diode D and the electrode region 2, shows a minimum value in the field-effect transistor according to the invention, while in addition in the construction described the electric connection 7 between the gate electrode 5 and the diode region 6 can be kept particularly short, so that this connection also introduces substantially no series resistance. As a result of this the diode D is particularly rapid and breakdown of the insulating layer 4 below the gate electrode 5 and destructively large charging current in the gate electrode 5 and the connection conductor 7, are checked very effectively.

The gate electrode 5 with the substrate 10 constitutes a capacity with the insulating layer 4 as a dielectric. This capacity is connected in parallel to the diode, which during charging also behaves as a capacity. By reducing the resistance of the current path through the diode, the diode is not only charged more rapidly, but in addition a larger part of the overall charge current which charges the two said capacities flows through the diode so that the possibility of too large currents in the connection conductor 7 and the gate electrode 5 is reduced.

The substrate may be kept very high ohmic without any objection which is of importance for the satisfactory operation of the field-effect transistor.

The breakdown voltage of the insulating layer below the gate electrode normally is approximately 100 v., while normal breakdown voltages for a safety diode are 40–70 volts. A further reduction of the inertia of the safety diode can be obtained by reducing the breakdown voltage of the diode. For many circuits a lower breakdown voltage of the safety diode is not detrimental at all. For example, it holds for a large number of circuit that the voltages between the gate electrode and the source electrode of the field-effect transistor during normal operation are smaller than 5 volt.

The breakdown voltage of the safety diode preferably is maximally 15 volt, while a particularly efficacious and sure safety is obtained with diodes having a breakdown voltage which lies between 5 and 10 volts. With such low breakdown voltages the safety diode can rapidly reach its breakdown voltage during charging, so that in practice the diode breaks down before the voltage between the gate electrode and the substrate can reach the breakdown voltage of the insulating layer.

The regions 2 and 6 can be obtained, for example, by diffusion of impurities, in which those skilled in the art can determine in the conventional manner how high the concentrations of impurities in said regions must be to obtain a breakdown voltage of the PN-junction between said regions which is smaller than 15 volt.

The field-effect transistor shown in FIG. 1 can entirely be manufactured in the conventional manner. The substrate 10 consists, for example, of a monocrystalline P-type silicon body having a resistivity of 10 Ohm. cm. The regions 1 and 2 can be obtained by diffusion of phosphorus, in which they show N-type conductivity and have a thickness, for example, of approximately 2.5 $\mu$m. and a surface concentration of approximately $10^{18}$ phosphorus atoms per ccm. The region 6 can be obtained by diffusion of, for example, boron and have P-type conductivity, a thickness of approximately 1 $\mu$m. and a surface concentration of approximately $10^{20}$ boron atoms per ccm. The further dimensions can be chosen in the conventional manner in accordance with the desired properties of the field-effect transistor to be manufactured. The PN-junctions between the regions 2 and 6 in the present example will have a breakdown voltage of approximately 8 volt.

The insulating layer 4 may consist, for example, of silicon oxide and/or silicon nitride. Below the gate electrode 5 the insulating layer 4 has a thickness, for example, of 0.1 $\mu$m., while below the conductive tracks 8 and 9, the thickness is preferably larger, for example, 0.5 $\mu$m. to prevent undesired channel formation. Undesired channel formation can alternatively be checked differently, for example, by diffused channel stoppers.

The metal layers and conductive tracks 5, 7, 8 and 9 may consist, for example, of aluminum.

It will be obvious that the invention is not restricted to the examples described and that many variations are possible to those skilled in the art without departing from the scope of the present invention. For example, the regions 1 and 2 may be comb-shaped regions which enter into each other wholly or partly, in which the gate electrode may have meander-shaped parts. The field-effect transistor may furthermore have more than one gate electrode, in which preferably a safety diode is provided between the source electrode and the adjoining first gate electrode. The gate electrode(s) may alternatively have an annular, at least a closed, geometry and may surround one of the electrode regions.

The invention relates both to field-effect transistors having an N-type channel region and to transistors having a P-type channel region, while furthermore they may be both of the enhancement type and of the depletion type.

Furthermore, commonly used materials other than those mentioned may be used, and the semiconductor body may consist, for example, of germanium or an $A_{III}B_{V}$ compound.

What is claimed is:

1. An insulated gate field-effect transistor device comprising a semiconductor body, spaced source and drain regions of the same one conductivity type in the body and adjacent its surface and defining a channel region in the body, said source region having a surface impurity concentration of less than approximately $10^{20}$ at/ccm., a further surface region of the opposite conductivity type nested within the source region and forming therewith a P-N junction, said further surface region having a surface impurity concentration greater than that of the source region, an insulating layer on the body surface extending over the channel region, a gate electrode on the insulating layer and over the channel, means forming a connection coupled to the source region, means forming an ohmic connection coupled to the drain region, means on the insulator directly connecting the gate electrode to the further surface region, and means for applying potentials to the various connections such that the P-N junction formed between the further surface region and the said source region is biased in the reversed direction.

2. An insulated gate field-effect transistor as set forth in claim 1 wherein the further surface region and the said source region have impurity contents such that the said P-N junction therebetween has a breakdown voltage of at most 15 volts.

3. An insulated gate field-effect transistor as set forth in claim 2 wherein an input circuit is coupled between the gate and the source region, and an output circuit is coupled between the source and drain regions, whereby the said P-N junction forms a safety diode connected between the gate electrode and the source region.

4. An insulated gate field-effect transistor as set forth in claim 3 wherein the body portion containing the source and drain regions is a P-type but of relatively high resistivity, the source and drain regions are of N-type but of relatively low resistivity, and the further region is of P-type but of relatively low resistivity.

5. An insulated gate field-effect transistor as set forth in claim 4 wherein means are provided connecting the body portion to the source region.

* * * * *

PO-1050
(5/69)

UNITED STATES PATENT OFFICE
CERTIFICATE OF CORRECTION

Patent No. 3624468 Dated November 30, 1971

Inventor(s) FREDERICK LEONARD JOHAN SANGSTER AND RIJKENT JAN NIENHUIS

It is certified that error appears in the above-identified patent and that said Letters Patent are hereby corrected as shown below:

Title Page, Column 1, line numbered [31], "6805785" should read -- 6805705 --.

Signed and sealed this 9th day of May 1972.

(SEAL)
Attest:

EDWARD M.FLETCHER,JR.
Attesting Officer

ROBERT GOTTSCHALK
Commissioner of Patents